United States Patent
Dutta et al.

(10) Patent No.: US 10,615,037 B2
(45) Date of Patent: Apr. 7, 2020

(54) TONE REVERSAL DURING EUV PATTERN TRANSFER USING SURFACE ACTIVE LAYER ASSISTED SELECTIVE DEPOSITION

(71) Applicant: International Business Machines Corporation, Armonk, NY (US)

(72) Inventors: Ashim Dutta, Menands, NY (US); Ekmini Anuja De Silva, Slingerlands, NY (US); Luciana Meli Thompson, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/104,371

(22) Filed: Aug. 17, 2018

(65) Prior Publication Data

US 2020/0058501 A1    Feb. 20, 2020

(51) Int. Cl.
*G03F 7/00* (2006.01)
*H01L 21/033* (2006.01)
*H01L 21/311* (2006.01)

(52) U.S. Cl.
CPC ...... *H01L 21/0337* (2013.01); *H01L 21/0332* (2013.01); *H01L 21/31116* (2013.01); *H01L 21/31122* (2013.01); *H01L 21/31138* (2013.01); *H01L 21/31144* (2013.01)

(58) Field of Classification Search
CPC ........... H01L 21/823842; H01L 29/165; H01L 29/4966; H01L 29/51; H01L 29/66545; H01L 29/66606; H01L 29/7848
See application file for complete search history.

(56) References Cited

U.S. PATENT DOCUMENTS

| 4,396,458 A * | 8/1983 | Platter ................. H01L 21/4846 216/19 |
| 5,331,495 A * | 7/1994 | Yoshida ............... G11B 5/3133 29/603.1 |
| 6,413,845 B1 * | 7/2002 | Izumi .................. H01L 29/4908 438/597 |

(Continued)

OTHER PUBLICATIONS

D. De Simone et al., "Photo Material Readiness at the Eve of EUVL HVM," Journal of Photopolymer Science and Technology, Jun. 2017, pp. 613-617, vol. 30, No. 5.

(Continued)

*Primary Examiner* — Jaehwan Oh
(74) *Attorney, Agent, or Firm* — Vazken Alexanian; Ryan, Mason & Lewis, LLP

(57) ABSTRACT

A method of manufacturing a semiconductor device includes forming a hard mask layer over a substrate and activating a surface of the hard mask layer to form a surface active layer over the hard mask layer. A resist layer is formed over the hard mask layer and a metal-containing layer is selectively formed over the surface active layer in at least one trench defined between portions of the resist layer. The resist layer is removed to define a pattern between portions of the selectively formed metal-containing layer and the hard mask layer is etched in accordance with the pattern. The etched pattern is transferred to at least a portion of the substrate and at least a portion of the hard mask layer, surface active layer, and metal-containing layer are removed.

16 Claims, 14 Drawing Sheets

(56) References Cited

U.S. PATENT DOCUMENTS

| | | | |
|---|---|---|---|
| 6,867,116 B1 | 3/2005 | Chung | |
| 7,632,351 B2 * | 12/2009 | Thompson | C23C 16/02 |
| | | | 117/104 |
| 8,084,186 B2 * | 12/2011 | Abdallah | G03F 7/40 |
| | | | 430/270.1 |
| 8,785,113 B2 | 7/2014 | Bradford et al. | |
| 8,836,082 B2 | 9/2014 | Lin et al. | |
| 9,499,698 B2 * | 11/2016 | Yao | H01L 21/02142 |
| 9,570,302 B1 * | 2/2017 | Chang | H01L 21/02118 |
| 9,627,217 B2 | 4/2017 | Shigaki et al. | |
| 9,653,319 B2 | 5/2017 | deVilliers et al. | |
| 9,728,406 B2 | 8/2017 | Dai et al. | |
| 9,791,779 B2 | 10/2017 | Huli | |
| 2009/0286188 A1 * | 11/2009 | Hatakeyama | G03F 7/40 |
| | | | 430/323 |
| 2010/0209855 A1 * | 8/2010 | Tanaka | G03F 7/38 |
| | | | 430/319 |
| 2010/0285409 A1 * | 11/2010 | Tanaka | H01L 21/0337 |
| | | | 430/315 |
| 2014/0212993 A1 * | 7/2014 | Deshpande | H01L 43/12 |
| | | | 438/3 |
| 2014/0313683 A1 * | 10/2014 | Kim | H01L 21/486 |
| | | | 361/774 |
| 2015/0115391 A1 * | 4/2015 | Roth | H01L 21/283 |
| | | | 257/490 |
| 2015/0187590 A1 * | 7/2015 | Ye | H01L 21/3086 |
| | | | 438/500 |
| 2015/0217330 A1 | 8/2015 | Haukka et al. | |
| 2017/0058401 A1 * | 3/2017 | Blackwell | C23C 16/18 |
| 2017/0110336 A1 * | 4/2017 | Hsu | H01L 21/31116 |
| 2017/0294310 A1 | 10/2017 | Tapily et al. | |
| 2018/0012752 A1 | 1/2018 | Tapily | |
| 2018/0308687 A1 * | 10/2018 | Smith | H01L 21/02186 |

OTHER PUBLICATIONS

A. Mameli et al., "Area-Selective Atomic Layer Deposition of In2O3:H Using a μ-Plasma Printer for Local Area Activation," Chemistry of Materials, Feb. 14, 2017, pp. 921-925, vol. 29, No. 3.

A.J.M. Mackus et al., "The Use of Atomic Layer Deposition in Advanced Nanopatterning," Nanoscale, Oct. 7, 2014, 22 pages, vol. 6, No. 19.

* cited by examiner

200

300

400

1200

1400

US 10,615,037 B2

TONE REVERSAL DURING EUV PATTERN TRANSFER USING SURFACE ACTIVE LAYER ASSISTED SELECTIVE DEPOSITION

BACKGROUND

Extreme ultraviolet lithography (EUV) resist thickness is a major limitation for transferring a pattern to an underlying film such as, e.g., bottom anti-reflective coatings (BARC), spin on silicon arc material (SiARC), low temperature oxide (LTO), silicon nitride (SiN), or other similar films in multi-layer semiconductor patterning stacks. Resist scumming and local thinning of resist lines add additional challenges to pattern transfer by causing bridges and line breaks.

SUMMARY

According to an exemplary embodiment of the present invention, a method of manufacturing a semiconductor device comprises forming a hard mask layer over a substrate and activating a surface of the hard mask layer to form a surface active layer over the hard mask layer. The method further comprises forming a resist layer over the hard mask layer and selectively forming a metal-containing layer over the surface active layer in at least one trench defined between portions of the resist layer. The method further comprises removing the resist layer to define a pattern between portions of the selectively formed metal-containing layer and etching the hard mask layer in accordance with the pattern. The method further comprises transferring the etched pattern to at least a portion of the substrate and removing at least a portion of the hard mask layer, surface active layer, and metal-containing layer. It is to be appreciated that the removal of the resist layer to form the pattern is an example of what is illustratively referred to herein as tone reversal or tone inversion.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION

Figure 1:
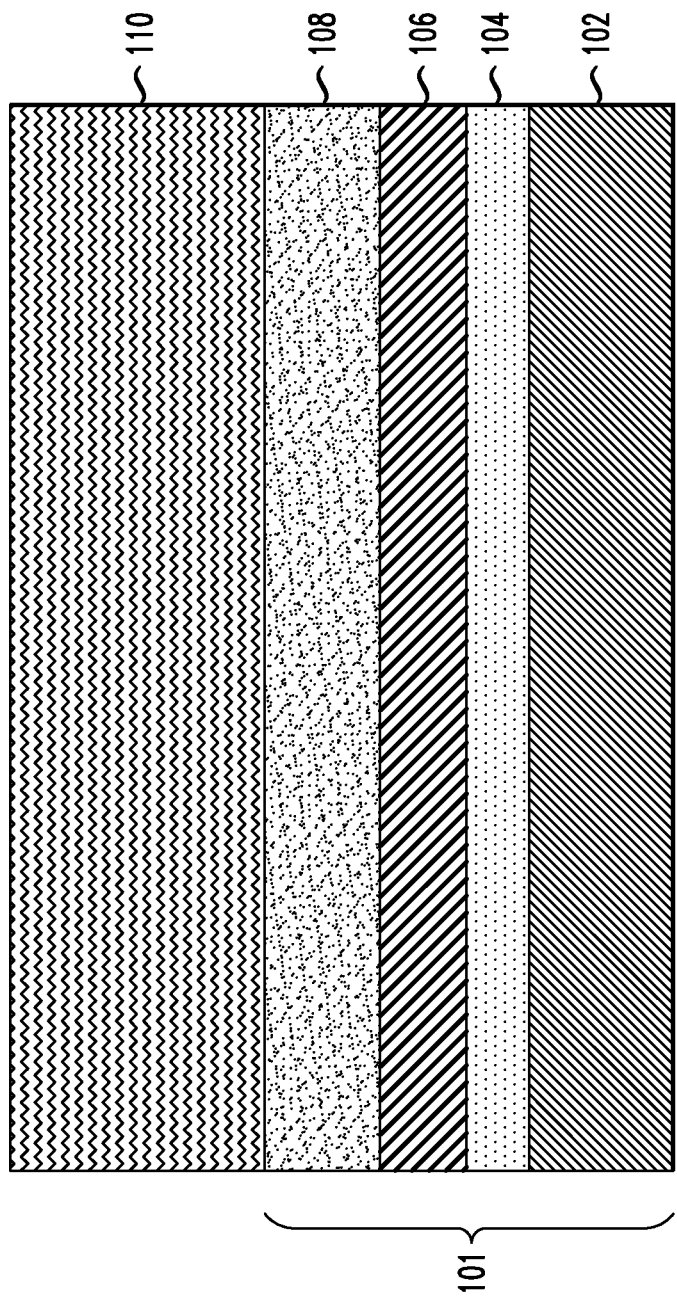
FIG. 1 shows a cross-sectional view of a semiconductor structure following formation of an organic planarizing layer (OPL) on a substrate in an illustrative embodiment.

In illustrative embodiments, techniques are provided for using selective deposition of a metal/metal oxide on a surface active layer during semiconductor manufacturing. More particularly, illustrative embodiments provide techniques for selectively depositing a metal/metal oxide on a surface active layer in trenches formed between portions of a resist layer, removing the resist layer, and performing etching pattern transfer to form various semiconductor structures. It is to be appreciated that the removal of the resist layer to form a pattern is an example of what is illustratively referred to herein as tone reversal or tone inversion. As will be explained in illustrative embodiments, such fabrication techniques are advantageous over conventional fabrication techniques.

It is to be understood that embodiments discussed herein are not limited to the particular materials, features, and processing steps shown and described herein. In particular, with respect to fabrication (forming or processing) steps, it is to be emphasized that the descriptions provided herein are not intended to encompass all of the steps that may be used to form a functional integrated circuit device. Rather, certain steps that are commonly used in fabricating such devices are purposefully not described herein for economy of description.

Moreover, the same or similar reference numbers are used throughout the drawings to denote the same or similar features, elements, layers, regions, or structures, and thus, a detailed explanation of the same or similar features, elements, layers, regions, or structures will not be repeated for each of the drawings. It is to be understood that the terms "about," "approximately" or "substantially" as used herein with regard to thicknesses, widths, percentages, ranges, etc., are meant to denote being close or approximate to, but not exactly. For example, the term "about" or "substantially" as used herein implies that a small margin of error is present such as, by way of example only, 1% or less than the stated amount.

In the figures, the illustrated scale of one layer, structure, and/or region relative to another layer, structure, and/or region is not necessarily intended to represent actual scale. One or more layers and/or regions of a type commonly used in, for example, a FET, a MOSFET, a complementary metal-oxide semiconductor (CMOS), nanowire FET, fin field-effect transistor (FinFET), vertical FET (VFET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, FETs, MOSFETs, VFETs, nanowire FETs, CMOSs and/or FinFETs. By way of non-limiting example, the semiconductor devices can include, but are not limited to FET, MOSFET, VFET, nanowire FET, CMOS and FinFET devices, and/or semiconductor devices that use FET, MOSFET, VFET, nanowire FET, CMOS and/or FinFET technology.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the cross-sectional views measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the cross-sectional views, and "horizontal" refers to a direction parallel to the top surface of the substrate in the cross-sectional views.

As used herein, unless otherwise specified, terms such as "on", "over", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "over", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

As noted above, embodiments of the present invention provide techniques to selectively form a metal or metal oxide on a surface active layer for use in lithography and EUV processes.

FIGS. 1 through 14 show portions of EUV lithography processes involving the selective formation of a metal-containing layer on a surface active layer between portions of a resist layer of a semiconductor structure in an illustrative embodiment. The EUV lithography process is applied to a semiconductor wafer in conjunction with the manufacture of integrated circuits. The figures illustrate respective cross-sectional views of a portion of the semiconductor wafer as it undergoes sequential processing operations as part of the EUV lithography process. It is to be appreciated that the various elements and other features shown in these figures are simplified for clarity and simplicity of illustration and are not necessarily drawn to scale. While described with reference to an EUV lithography process, in some embodiments, other lithography processes are used outside of the EUV range to apply the disclosed process and techniques.

Referring initially to FIG. 1, a semiconductor structure 100 represents a portion of a semiconductor wafer having a substrate 101. At least portions of the substrate 101 may be formed of silicon (Si), and may have a thickness of about 500 to 1000 micrometers (m). The substrate 101 may itself comprise multiple layers. For example, in some illustrative embodiments, substrate 101 may comprise four layers as shown in FIG. 1. For example, substrate 101 may comprise an ultra low dielectric constant (ULK) layer 102, silicon based layer 104, metal based layer 106, and an oxide layer 108.

In some embodiments, ULK layer 102 may be formed of, for example, organosilicate glasses, often called SiCOH which denotes the elements contained in these films which include silicon (Si), carbon (C), oxygen (O), and hydrogen (H). In some embodiments, for example, ULK layer 102 may be formed of a porous SiCOH (p-SiCOH), porous SiCNO (p-SiCNO), porous SiNCH (p-SiNCH), or other ULK materials.

In some embodiments, silicon based layer 104 may be formed, for example, of silicon nitride (SiN).

In some embodiments, metal based layer 106 may be formed, for example, of titanium nitride (TiN).

In some embodiments, oxide layer 108 may be formed, for example, of silicon oxide (SiO), silicon dioxide ($SiO_2$), or other common oxide materials.

While illustrated with the above described four layers in FIG. 1 for clarity and simplicity of illustration, substrate 101 may in some illustrative embodiments comprise more than four layers or fewer than four layers and some or all of the layers may be different than layers 102, 104, 106, and 108 described above. The semiconductor structure 100 further comprises an organic planarizing layer (OPL) 110 formed on the substrate 101. The OPL 110 in some embodiments is formed to a thickness of approximately 60 nm, although these and other dimensions are presented herein as illustrative examples and should not be construed as limiting. In some embodiments, no OPL may be formed on the semiconductor structure.

Figure 2:
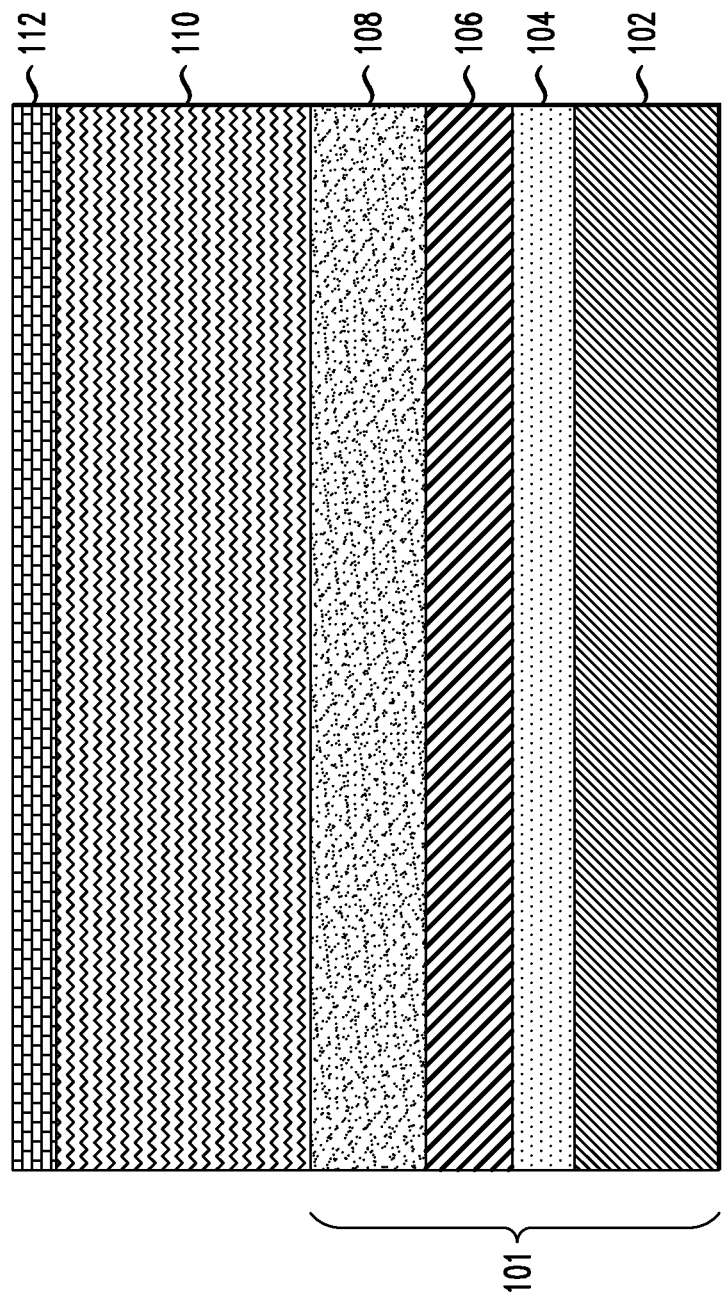
FIG. 2 shows a cross-sectional view of a semiconductor structure following formation of a hard mask layer over the organic planarizing layer of the semiconductor structure of FIG. 1 in an illustrative embodiment.

As shown in FIG. 2, a hard mask layer 112 is formed over the OPL 110, resulting in a semiconductor structure 200. The hard mask layer 112 is illustratively formed of silicon-based materials such as, e.g., silicon oxide (SiO), silicon dioxide ($SiO_2$), silicon nitride (SiN), silicon oxynitride (SiON), silicon oxycarbide (SiOC), silicon carbide (SiC), amorphous silicon (a-Si), and spin on silicon arc material (SiARC), although a wide variety of other inorganic or organic materials could be used. The hard mask layer 112 may have a thickness in the range of about 3 nm to 15 nm. In some embodiments, the hard mask layer 112 may be formed over the substrate 101 without an intervening OPL 110.

Figure 3:
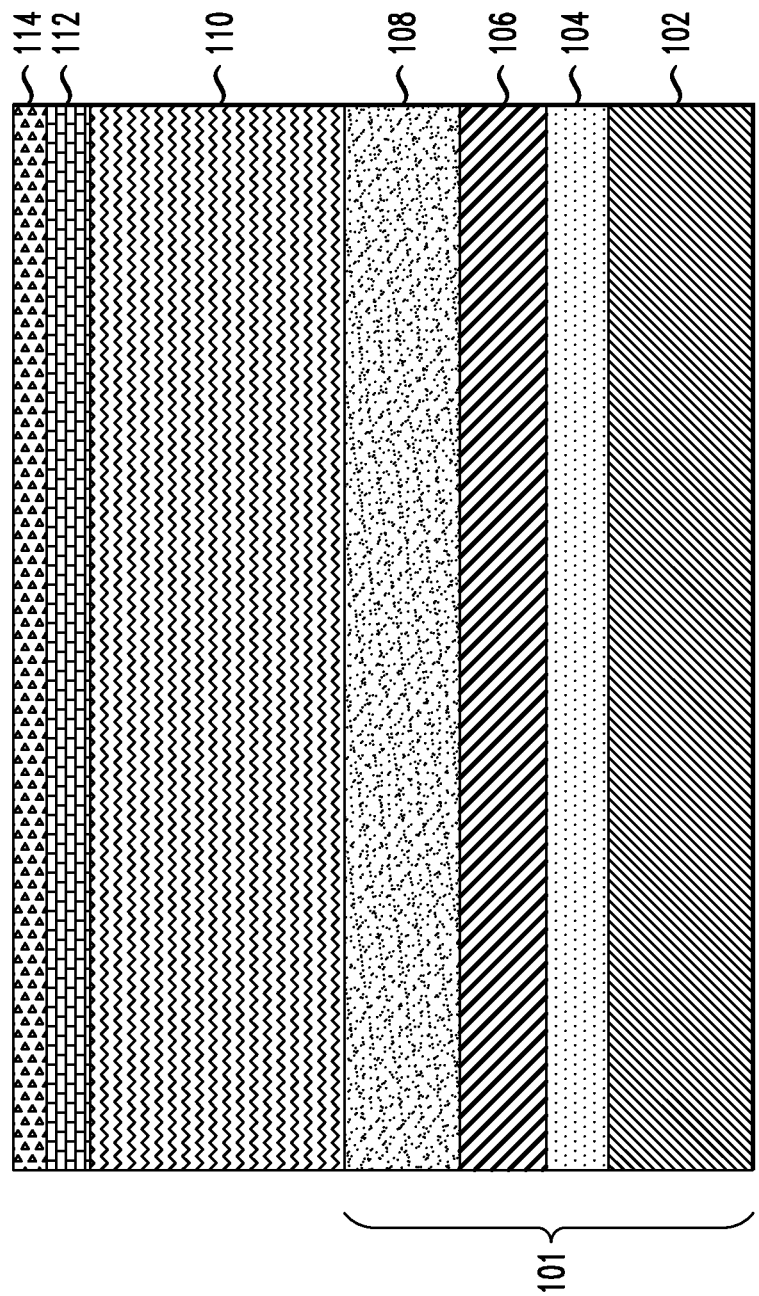
FIG. 3 shows a cross-sectional view of a semiconductor structure following formation of a surface active layer over the hard mask layer of the semiconductor structure of FIG. 2 in an illustrative embodiment.

With reference now to FIG. 3, in an illustrative embodiment, a surface active layer 114 is illustratively formed on the hard mask layer 112, resulting in a semiconductor structure 300. Surface active layer 114 may in some embodiments be a self-assembled monolayer (SAM), functionalized polymer brush, or other similar material. Surface active layer 114 may be formed on hard mask layer 112 through a process such as, e.g., chemical grafting, plasma activation or other similar processes to activate or modify a surface of hard mask layer 112. For example, in some embodiments, surface active layer 114 may include a head group that may be grafted to the hard mask layer 112 and a tail group that functions to grow a metal-containing material such as, e.g., a metal, a metal oxide, a metal nitride or a metal oxynitride. In some embodiments, the surface activation of the surface of the hard mask layer 112 may occur with a polar moiety.

In some embodiments, surface active layer 114 may be hydrophilic such that, for example, surface active layer 114 may be functionalized with carboxylic acid (COOH), hydroxide (OH), aminyl radical ($NH_2$), or combinations thereof to enable precursor growth of the metal-containing material, e.g., a metal, metal oxide, metal nitride, or metal oxynitride, in the surface active area 114. Surface activation layer 114 may be configured to enable selective self deposition of a metal-containing material such as, e.g., a metal, metal oxide, metal nitride, metal oxynitride, on a surface thereof.

Figure 4:
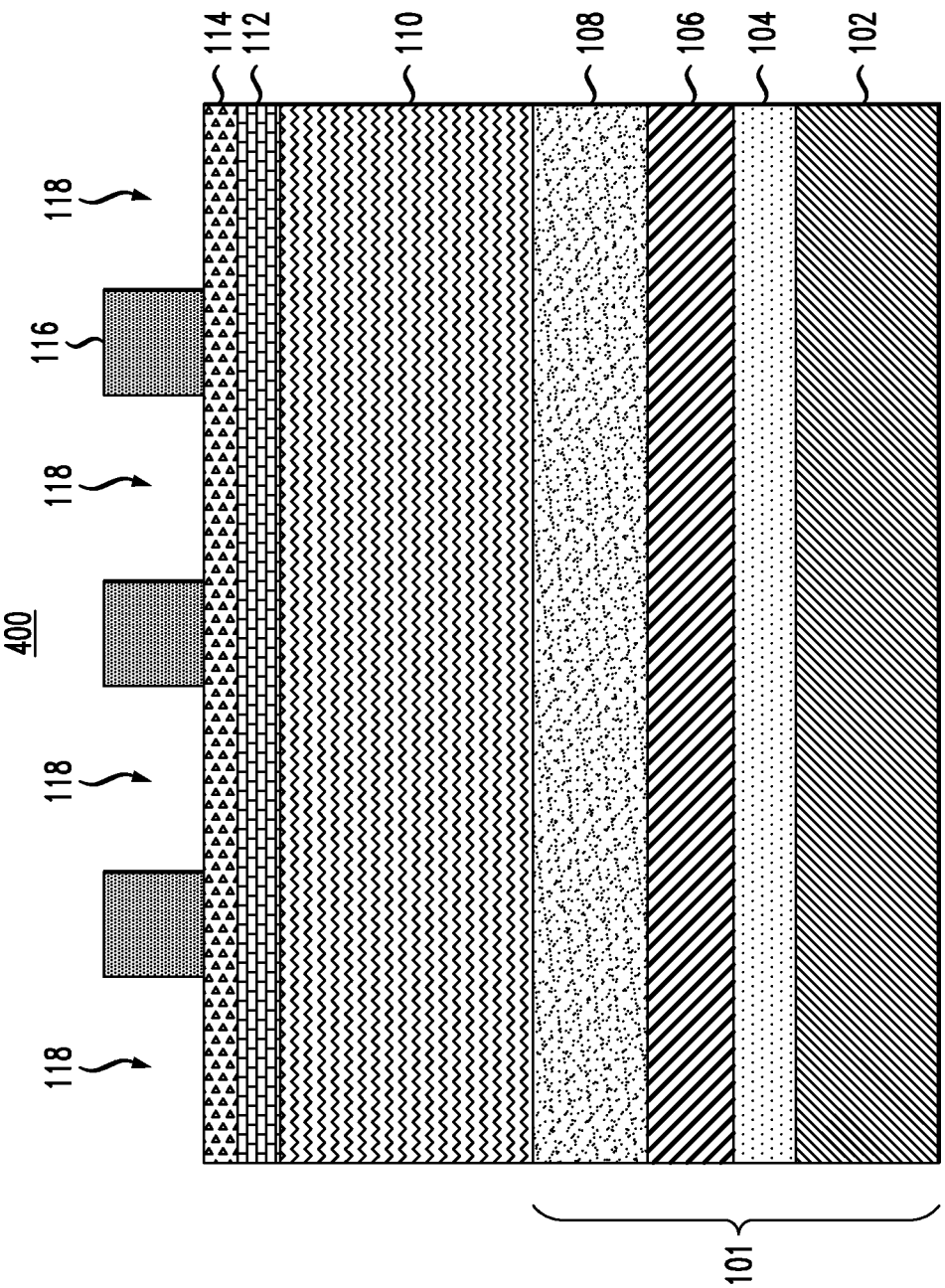
FIG. 4 shows a cross-sectional view of a semiconductor structure following formation of a resist layer over the surface active layer of the semiconductor structure of FIG. 3 in an illustrative embodiment.

With reference now to FIG. 4, in an illustrative embodiment, a resist layer 116 is illustratively formed on surface active layer 114, resulting in a semiconductor structure 400. For example, resist layer 116 may be formed in a particular pattern or arrangement, e.g., as illustrated in FIG. 4, using a lithographic process such as, e.g., extreme ultraviolet lithography (EUV), deep ultraviolet lithography (DUV), or other similar lithographic processes. In some embodiments, for example, DUV in the 193 nm range may be used. As shown in FIG. 4, for example, resist layer 116 may form a pattern such that trenches 118 are present between portions of resist layer 116 which expose surfaces of surface active layer 114. In some embodiments, resist layer 116 may comprise an organic material such as, e.g., an organic chemically amplified resist (CAR). In some embodiments, the surfaces of resist layer 116 may be hydrophobic. In some embodiments, a surface of resist layer 116 may be more hydrophobic than a surface of the surface active layer 114.

In some embodiments, after formation of the resist layer 116, a resist descum process may be applied to the semiconductor structure 400 to remove excess material that may have been deposited on the surface active layer 114 during formation of resist layer 116.

Figure 5:
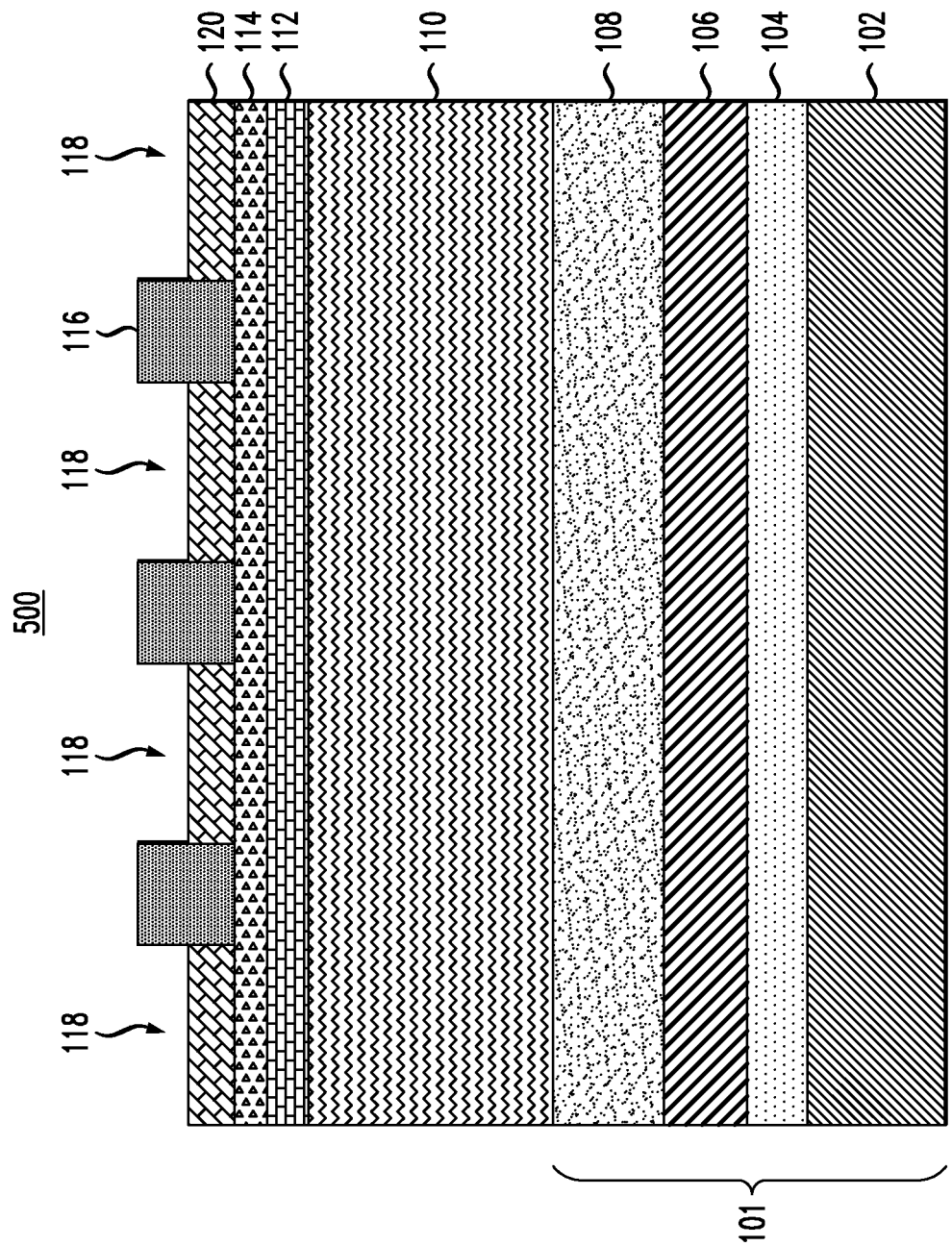
FIG. 5 shows a cross-sectional view of a semiconductor structure following formation of a metal-containing layer over the surface active layer in between portions of the resist layer of the semiconductor structure of FIG. 4 in an illustrative embodiment.

With reference now to FIG. 5, in an illustrative embodiment, a metal-containing layer 120 is illustratively formed on surface active layer 114 in the trenches 118 between the portions of resist layer 116, resulting in a semiconductor structure 500. For example, the metal-containing layer 120 may be selectively formed on the surface active layer 114. In some embodiments, the metal-containing layer 120 may be formed of a metal such as, e.g., tungsten (W), copper (Cu), cobalt (Co), ruthenium (Ru), titanium nitride (TiN), titanium oxynitride (TiON), tantalum nitride (TaN), tantalum silicon nitride (TaSiN), titanium silicon nitride (TiSiN), titanium silicon oxide (TiSiO), cobalt silicide (CoSi), or any combination thereof. In some embodiments, the metal-containing layer 120 may be formed of a metal oxide such as, e.g., hafnium oxide (HfO2), zirconium dioxide (ZrO2), titanium dioxide (TiO2), aluminum oxide (Al2O3), Zinc oxide (ZnO), or any combination thereof.

In some embodiments, metal-containing layer 120 may be selectively grown or deposited on the surface active layer 114. For example, during deposition or forming of the metal-containing layer 120 on the surface active layer 114, the hydrophilic surface of the surface active layer 114 may serve as a seed for growth of the metal-containing layer 120. In some embodiments, the material for the metal-containing layer 120 or resist layer 116 may be selected such that growth of the metal-containing layer 120 on the resist layer 116 is inhibited.

In some embodiments, for example, atomic layer deposition (ALD) may be used to form the metal-containing layer 120 on the surface active layer 114, e.g., a polar surface, while inhibiting the deposition of the metal-containing layer 120 on the resist layer 116, e.g., a non-polar hydrophobic surface. For example, the atomic layer deposition may take advantage of a reactivity difference between the surface functionalized surfaces and organic photoresist surfaces, removing the need to use additional aides such as, e.g., organic blocking layers, that may inhibit ALD growth.

Figure 6:
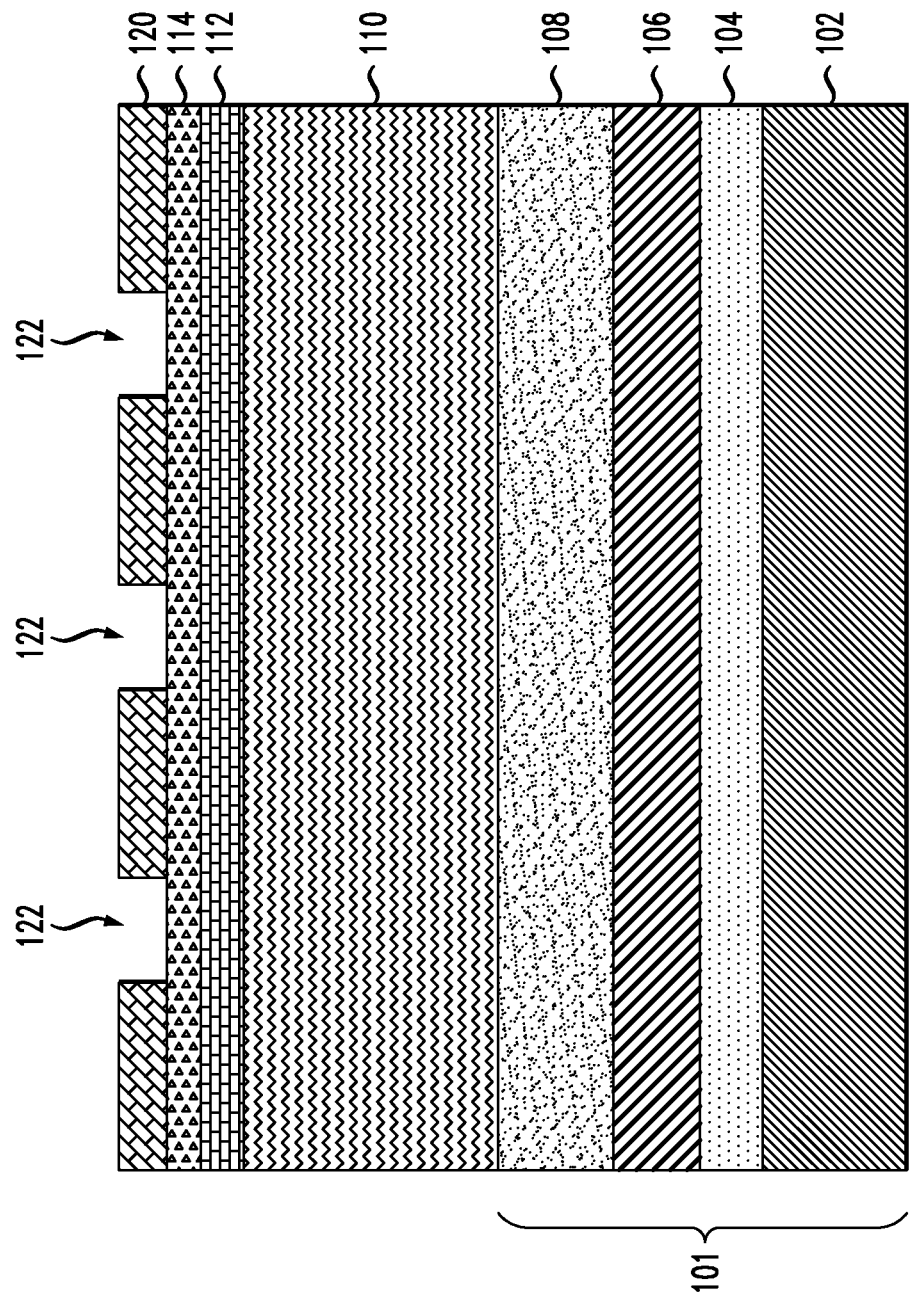
FIG. 6 shows a cross-sectional view of a semiconductor structure following removal of the resist layer from the semiconductor structure of FIG. 5 in an illustrative embodiment.

With reference now to FIG. 6, after the metal-containing layer 120 has been formed on the surface active layer 114, resist layer 116 may be removed, for example, using a reactive ion etch (RIE) containing oxygen based, hydrogen based, or other similar chemistry, that may be used to remove an organic layer, resulting in a semiconductor structure 600. Removal of the resist layer 116 reveals a pattern 122 in the metal-containing layer 120 which was formed due to the selective deposition of the metal-containing layer 120 on the surface active layer 114 in the trenches 118 formed between the portions of resist layer 116, e.g., a tone reversal or tone inversion of the pattern defined by the trenches of the resist layer 116.

Figure 7:
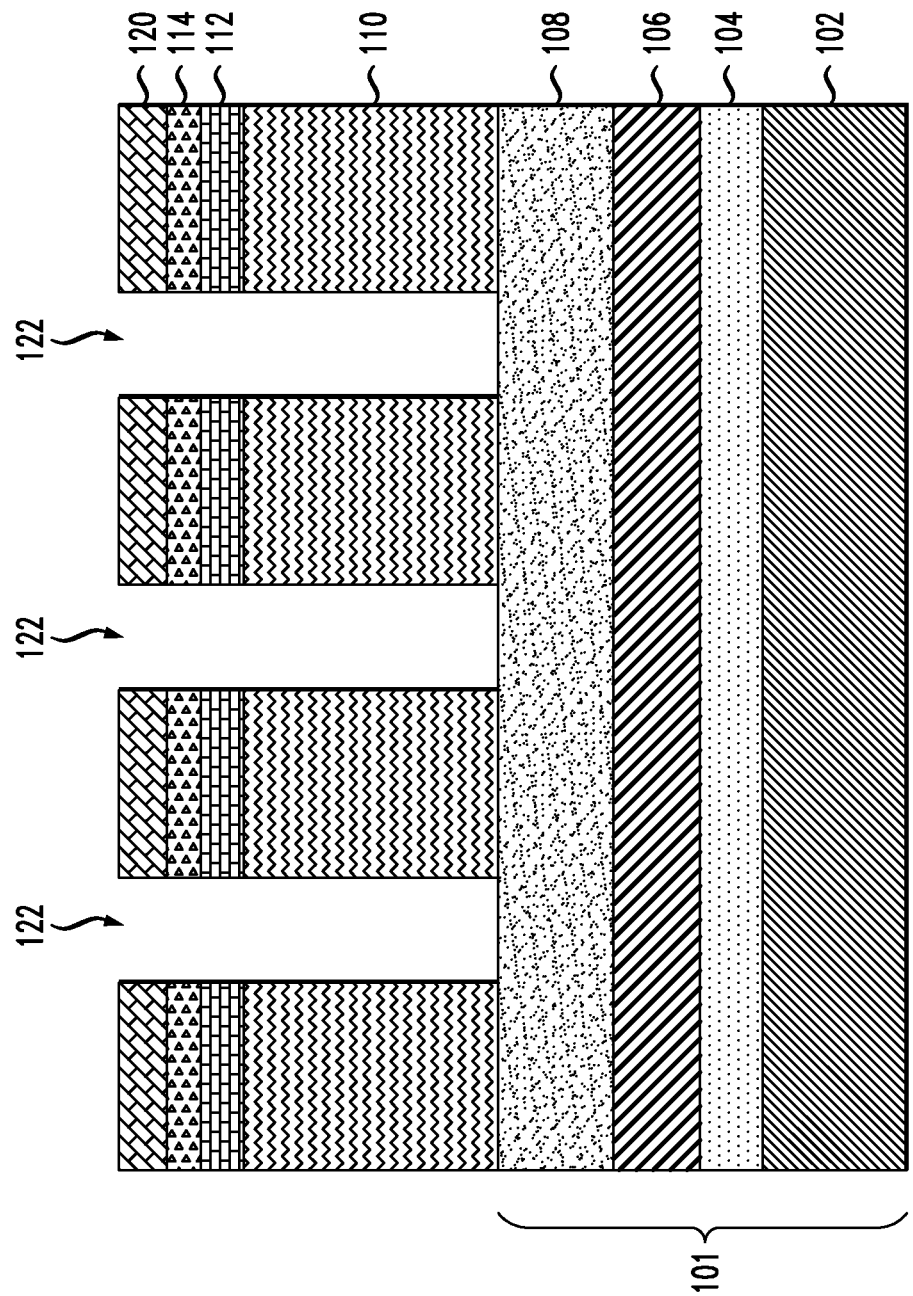
FIG. 7 shows a cross-sectional view of a semiconductor structure following etching of the surface active layer, hard mask layer, and OPL of the semiconductor structure of FIG. 6 in accordance with a pattern formed in the metal-containing layer in an illustrative embodiment.

With reference now to FIG. 7, the revealed pattern 122 is etched into semiconductor structure 600, e.g., using reactive ion etching or other forms of etching, resulting in a semiconductor structure 700. For example, pattern 122 may be etched into surface active layer 114, hard mask 112, and OPL 110. For example, in some embodiments, a tri-layer mask etch may be used. In some embodiments, for example, fluorine based chemistry may be used to etch the pattern 122 into surface active layer 114 and hard mask 112, and oxygen based chemistry may be used to etch OPL 110 producing semiconductor structure 700. In some embodiments, the oxidized layer 108 may inhibit further chemical etching of the pattern 122 into the layers comprising the substrate.

Figure 8:
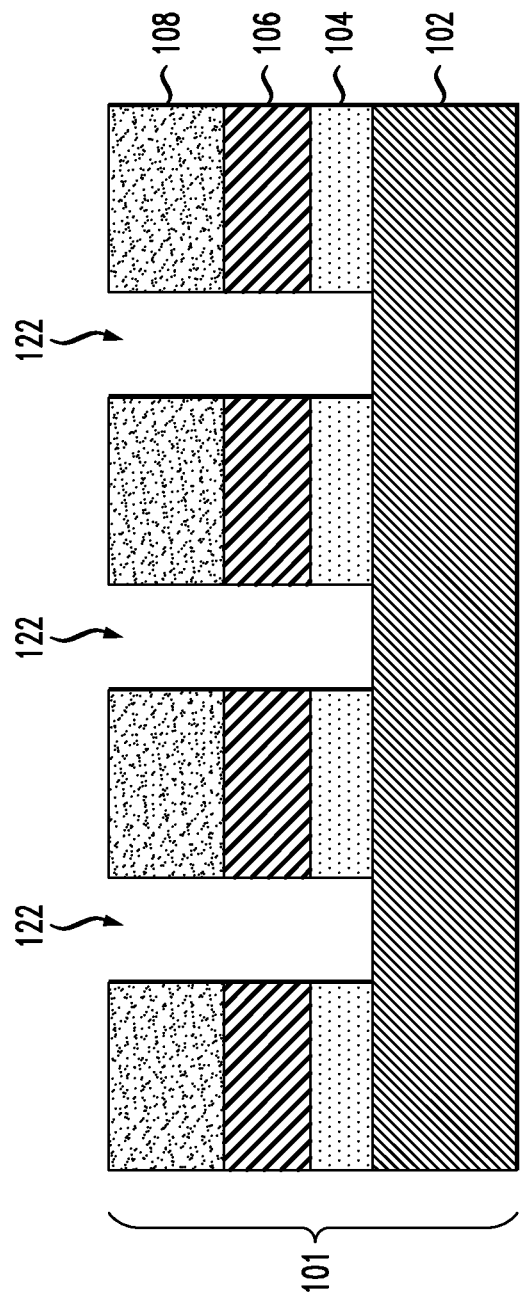
FIG. 8 shows a cross-sectional view of a semiconductor structure showing a transfer of the etched pattern of the semiconductor structure of FIG. 7 to the substrate and removal of the metal-containing layer, surface active layer, hard mask layer, and OPL in an illustrative embodiment.

With reference now to FIG. 8, the pattern 122 may be transferred to the substrate 101. For example, as illustrated in FIG. 8, the pattern 122 may be transferred to the oxide layer 108 using fluorine based chemistry, titanium based layer 106 using chlorine based chemistry, and silicon based layer 104 using fluorine based chemistry. In some embodiments, the chemistries used to etch layers 108, 106 and 104 will also remove surface active layer 114, hard mask layer 112 and at least a portion of OPL 110, e.g., from the top down. Any remaining portion of OPL 110 may be subsequently removed using oxygen based OPL ash chemistry, resulting in a semiconductor structure 800. In some embodiments, the pattern 122 may not be transferred to the ULK layer 102.

The semiconductor structure 800 is then subject to additional processing operations of a type well known to those skilled in the art, in order to form desired integrated circuit structures on the semiconductor wafer. For example, portions of the process as previously described in conjunction with FIGS. 1 through 8 can be repeated with different pattern masks in order to further configure the substrate 101 in accordance with additional pattern features.

With reference now to FIGS. 1, 2, and 9-14, in another illustrative embodiment, the resist layer may be formed directly on the hard mask layer before the surface active layer.

Figure 9:
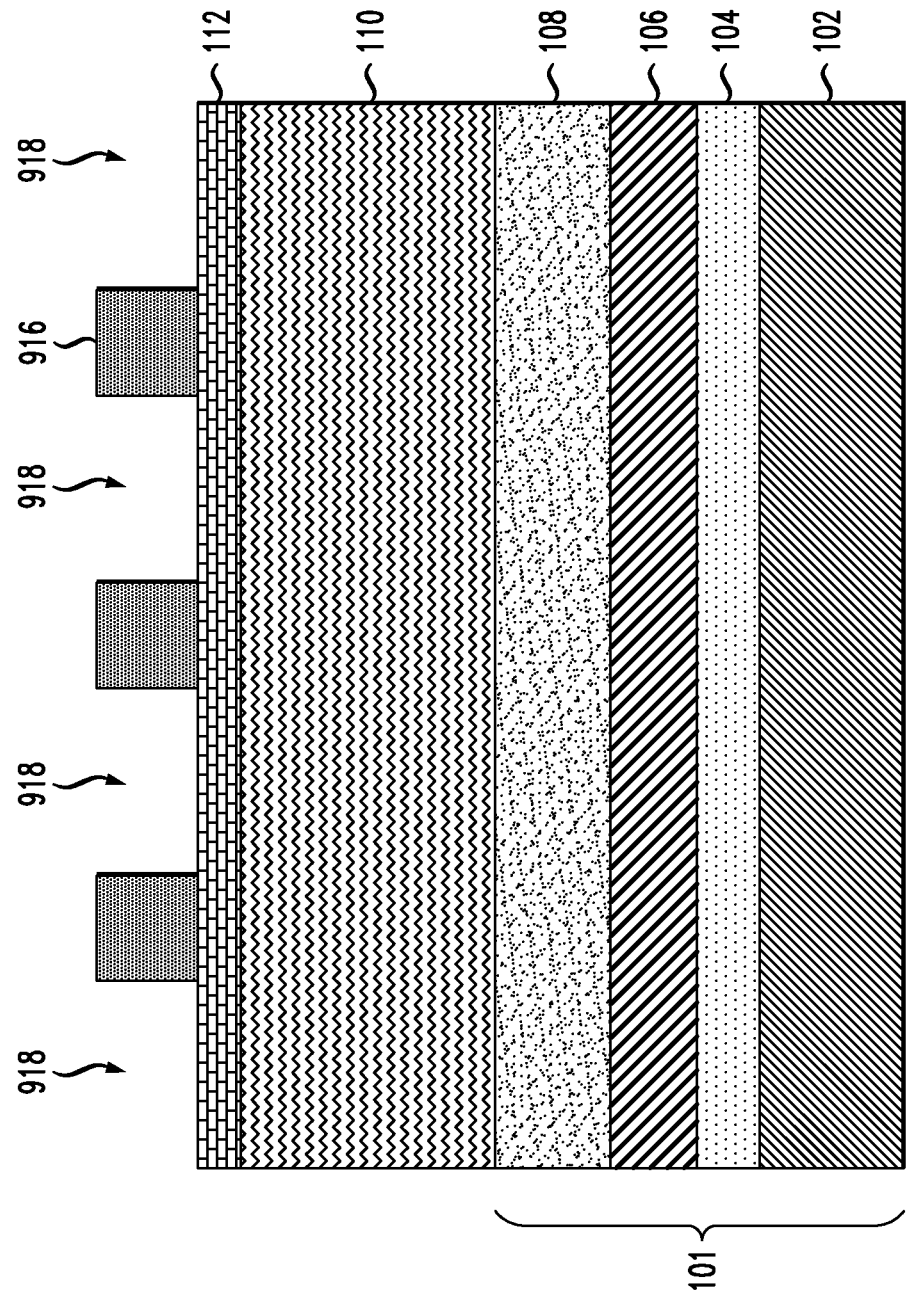
FIG. 9 shows a cross-sectional view of a semiconductor structure following formation of a resist layer over the hard mask layer of the semiconductor structure of FIG. 2 in an illustrative embodiment.

For example, with reference now to FIG. 9, a resist layer 916 may be formed directly on the hard mask 112 of semiconductor structure 200 (FIG. 2) in a similar manner to that described above for resist layer 116, resulting in a semiconductor structure 900. Trenches 918 are defined between the portions of resist layer 916 in a similar manner to trenches 118 that extend to the hard mask layer 112. In this embodiment, the resist descum process may be performed prior to the formation of the surface active layer to remove any remaining resist residue in the trenches 918.

Figure 10:
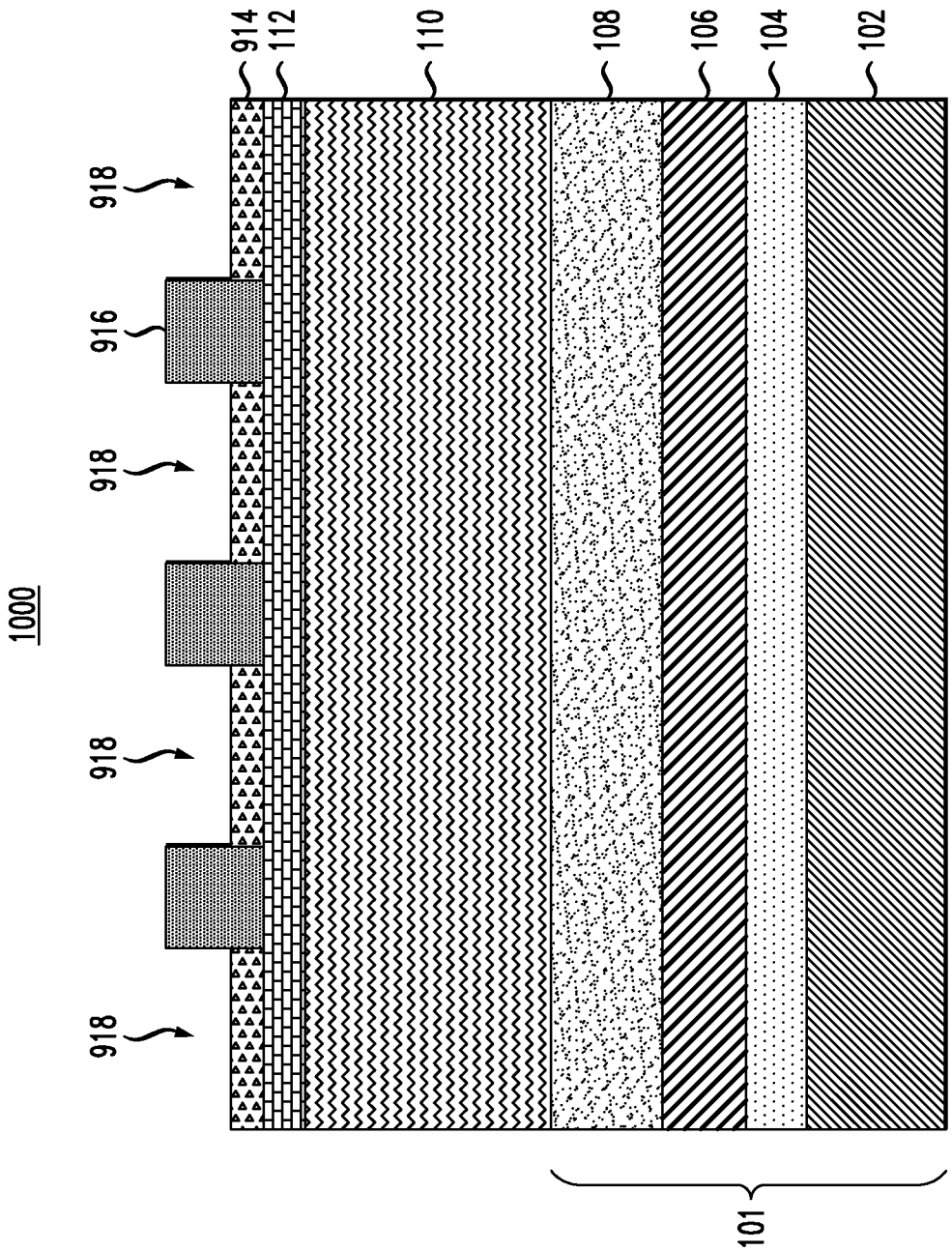
FIG. 10 shows a cross-sectional view of a semiconductor structure following formation of a surface active layer over the hard mask layer in between portions of the resist layer of the semiconductor structure of FIG. 9 in an illustrative embodiment.

With reference now to FIG. 10, a surface active layer 914 is illustratively formed on the hard mask layer 112 in trenches 918 between the portions of resist layer 916 in a similar manner to that described above for surface active layer 114, resulting in a semiconductor structure 1000. In some embodiments, the material and manner of formation of surface active layer 914 may be selected such that surface active layer 914 forms on hard mask layer 112, e.g., grafts to hard mask layer 112, but not on resist layer 916, e.g., does not graft onto resist layer 916. For example, the binding group and the grafting process conditions are chosen to enable preferential grafting of the surface active layer 914 to the hard mask layer 112 in the trench area. In some embodiments, for example, self-assembled monolayer or polymer brushes terminated with phosphonic acid will graft to a silicon oxide hard mask layer selective to the organic resist layer when coated and baked, for example, between about 60° C. and about 100° C.

Figure 11:
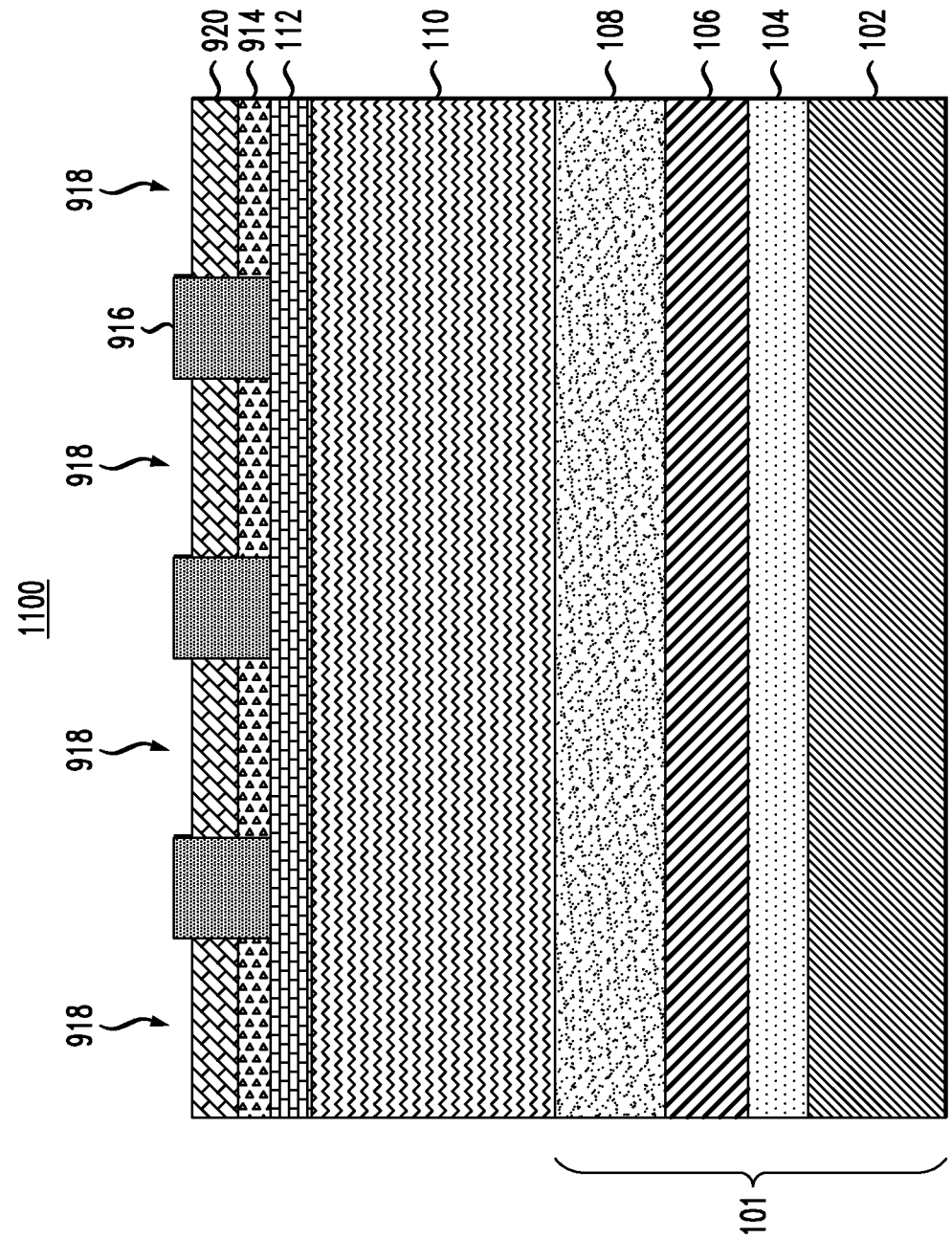
FIG. 11 shows a cross-sectional view of a semiconductor structure following formation of a metal-containing layer over the surface active layer in between the portions of the resist layer of the semiconductor structure of FIG. 10 in an illustrative embodiment.

With reference now to FIG. 11, in this illustrative embodiment, a metal-containing layer 920, similar to metal-containing layer 120, is illustratively formed on surface active layer 914 in the trenches 918 between the portions of resist layer 916 in a similar manner to that described above for metal-containing layer 120, resulting in a semiconductor structure 1100.

Figure 12:
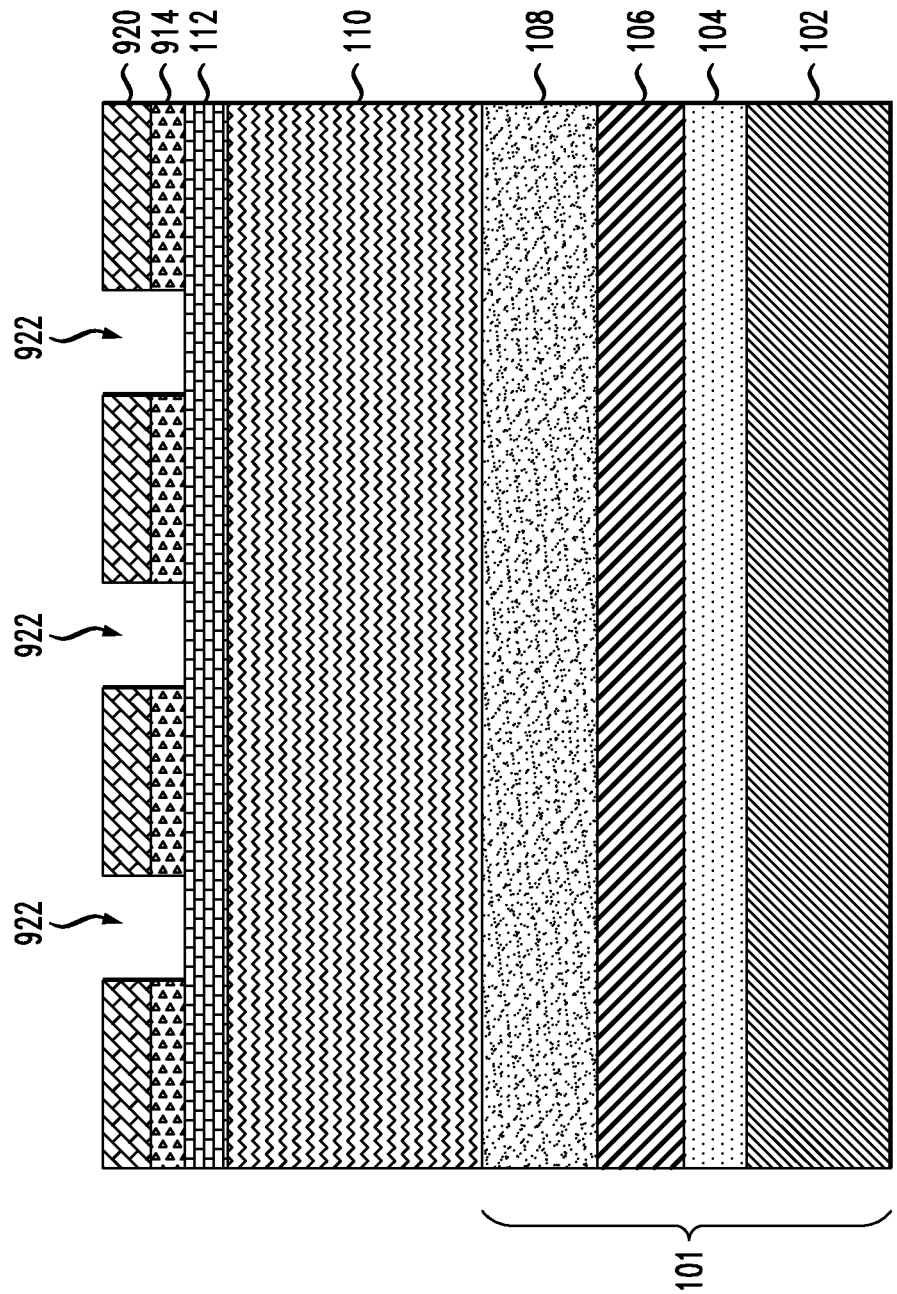
FIG. 12 shows a cross-sectional view of a semiconductor structure following removal of the resist layer from the semiconductor structure of FIG. 11 in an illustrative embodiment.

With reference now to FIG. 12, after the metal-containing layer 920 has been formed on the surface active layer 914, resist layer 916 may be removed, for example, as described above for resist layer 116, resulting in a semiconductor structure 1200. Removal of the resist layer 916 reveals a pattern 922 in the metal-containing layer 920 which was formed due to the selective deposition of the metal-containing layer 920 on the surface active layer 914 in the trenches 918 formed between the portions of resist layer 916, e.g., a tone reversal of the trenches defined by the resist layer 916.

Figure 13:
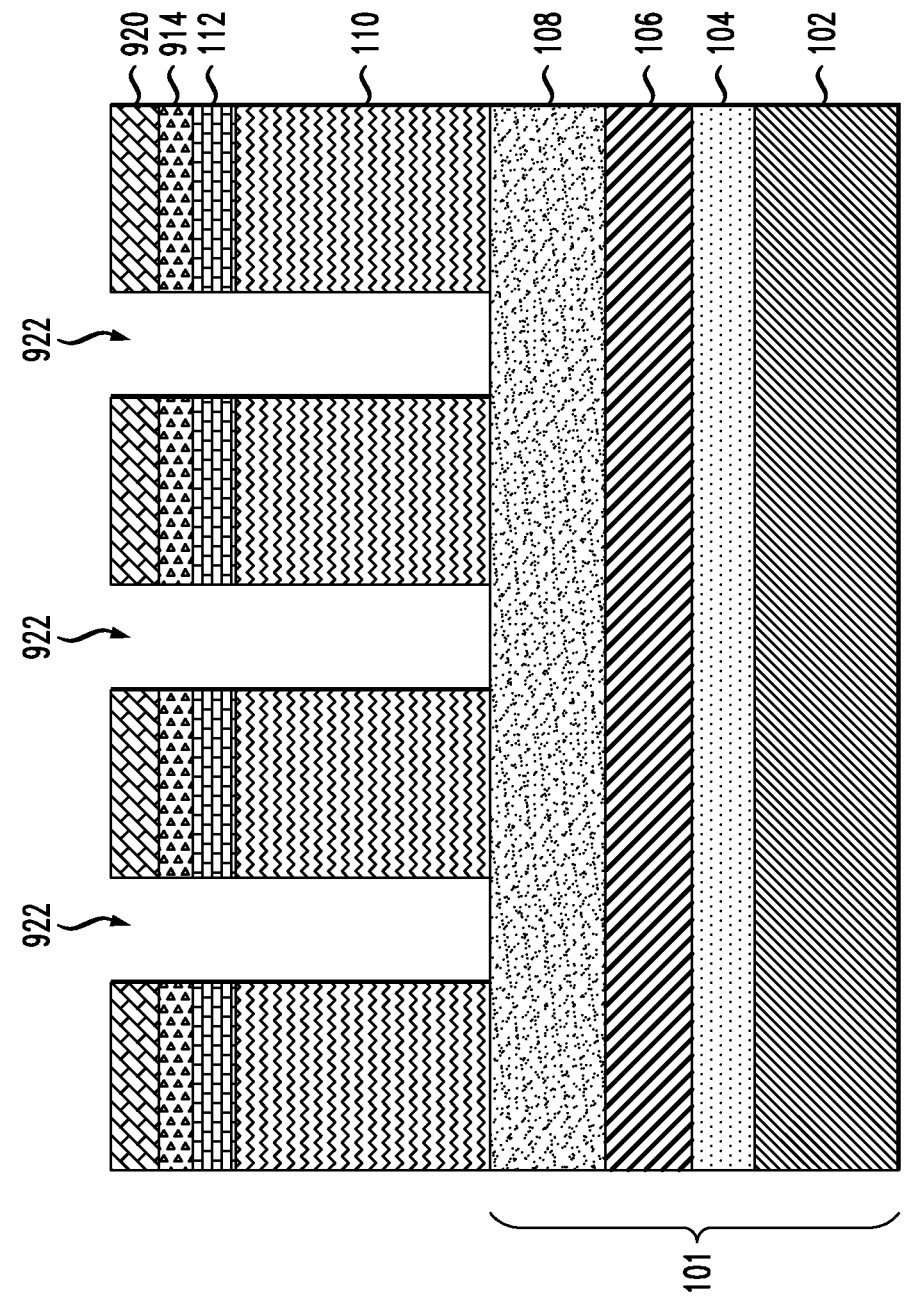
FIG. 13 shows a cross-sectional view of a semiconductor structure following etching of the surface active layer, hard mask layer, and OPL of the semiconductor structure of FIG. 12 in accordance with a pattern formed in the metal-containing layer in an illustrative embodiment.

With reference now to FIG. 13, the revealed pattern 922 is etched into the semiconductor structure 1200, in a similar manner to that described above for the etching of pattern 122, resulting in a semiconductor structure 1300.

Figure 14:
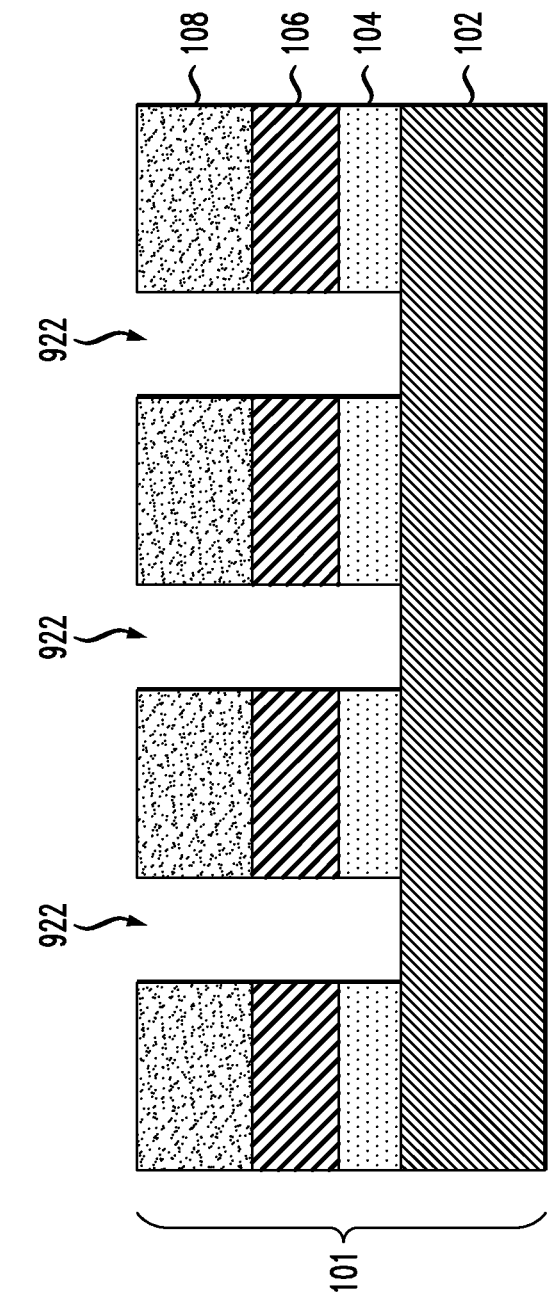
FIG. 14 shows a cross-sectional view of a semiconductor structure showing a transfer of the etched pattern of the semiconductor structure of FIG. 13 to the substrate and removal of the metal-containing layer, surface active layer, hard mask layer, and OPL in an illustrative embodiment.

With reference now to FIG. 14, the pattern 922 may be transferred to the substrate 101 in a similar manner to that described above for the transfer of pattern 122 to the substrate 101 and the metal-containing layer 920, surface active layer 914, hard mask layer 112, and OPL 110 may be removed, resulting in a semiconductor structure 1400.

The semiconductor structure 1400 is then subject to additional processing operations of a type well known to those skilled in the art, in order to form desired integrated circuit structures on the semiconductor wafer. For example, portions of the process as previously described in conjunction with FIGS. 1, 2, and 9 through 14 can be repeated with different pattern masks in order to further configure the substrate 101 in accordance with additional pattern features.

In some embodiments, precursor and process conditions may be chosen to optimize or enable selective deposition of the metal-containing layers 120 and 920 on the surface active layers 114 and 914. For example, temperature, precursor type, and gas flow parameters may be optimized for deposition selectivity.

For example, precursor selection may make a significant difference in the amount of deposition of a metal-containing layer on different substrates. In a first illustrative example, a $TiO_x$ metal-containing layer is deposited on a precursor comprising a-Si hard mask terminated with a COOH surface activated layer. In a second illustrative example, a $TiO_x$ metal-containing layer is deposited on a precursor comprising a-Si hard mask terminated with a native oxide surface activated layer. In a third illustrative example, a $TiO_x$ metal-containing layer is deposited on a precursor comprising a-Si hard mask terminated with a H surface activated layer.

In the first example, when the $TiO_x$ metal-containing layer is deposited on the precursor comprising the a-Si hard mask terminated with a COOH surface activated layer, approximately 20% to approximately 35% deposition of $TiO_x$ occurs over 10 to 50 Plasma Enhanced Atomic Layer Deposition (PEALD) cycles.

In the second example, when the $TiO_x$ metal-containing layer is deposited on the precursor comprising the a-Si hard mask terminated with a native oxide surface activated layer, approximately 16% to approximately 25% deposition of $TiO_x$ occurs over 10 to 40 PEALD cycles, with a drop off from 25% to approximately 18% at 50 PEALD cycles.

In the third example, when the $TiO_x$ metal-containing layer is deposited on the precursor comprising the a-Si hard mask terminated with a H surface activated layer, a significantly lower % of $TiO_x$ deposition on the order of approximately 0.2% to 1% occurs over 10 to 50 PEALD cycles.

As can be seen from these examples, the selection of the precursor in some embodiments makes a significant difference it the deposition of the metal-containing layer.

In some embodiments, temperature selection for the EUV resist also makes a significant difference. For example, the use of a deposition temperature of 75° C. on an EUV resist results in approximately 0.2 to 2% deposition of the $TiO_x$ over the phororesist at 10 to 50 PEALD cycles while the use of a deposition temperature of 125° C. on an EUV resist results in approximately 10% to 20% deposition of $TiO_x$ over photoresist at 10 to 50 PEALD cycles.

It is to be understood that the methods discussed herein for fabricating semiconductor structures can be incorporated within semiconductor processing flows for fabricating other types of semiconductor devices and integrated circuits with various analog and digital circuitry or mixed-signal circuitry. In particular, integrated circuit dies can be fabricated with various devices such as transistors, diodes, capacitors, inductors, etc. An integrated circuit in accordance with embodiments can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein.

Furthermore, various layers, regions, and/or structures described above may be implemented in integrated circuits (chips). The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Although illustrative embodiments have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A method of manufacturing a semiconductor device, comprising:
forming a hard mask layer over a substrate;
activating a surface of the hard mask layer to form a surface active layer over the hard mask layer;
forming a resist layer over the hard mask layer;
selectively forming a metal-containing layer over the surface active layer in at least one trench defined between portions of the resist layer;
removing the resist layer to define a pattern between portions of the selectively formed metal-containing layer;
etching the hard mask layer in accordance with the pattern;
transferring the etched pattern to at least a portion of the substrate; and
removing at least a portion of the hard mask layer, surface active layer, and metal-containing layer.

2. The method of claim 1, wherein the resist layer is formed over the surface active layer.

3. The method of claim 1, wherein the surface active layer is formed over the hard mask layer in the at least one trench defined between the portions of the resist layer.

4. The method of claim 1, wherein the surface active layer is formed after the forming of the resist layer.

5. The method of claim 1, wherein the surface active layer is formed by activation of the hard mask layer using at least one of chemical grafting and plasma activation.

6. The method of claim 1, wherein selectively forming a metal-containing layer over the surface active layer in the at least one trench defined between the portions of the resist layer comprises selectively forming the metal-containing layer over the surface active layer utilizing a deposition process.

7. The method of claim 6, wherein the deposition process comprises an atomic layer deposition process.

8. The method of claim 1, wherein selectively forming a metal-containing layer over the surface active layer in the at least one trench defined between the portions of the resist layer comprises selectively growing the metal-containing layer on at least one exposed surface of the surface active layer in the at least one trench.

9. The method of claim 1, wherein the hard mask layer is activated to form the surface active layer using a carboxylic acid based surface activation.

10. The method of claim 1, wherein the metal-containing layer comprises a metal selected from the group consisting of W, Cu, Co, Ru, TiN, TiON, TaN, TaSiN, TiSiN, TiSiO, CoSi, and combinations thereof.

11. The method of claim 1, wherein the metal-containing layer comprises a metal oxide selected from the group consisting of $HfO_2$, $ZrO_2$, $TiO_2$, $Al_2O_3$, ZnO, and combinations thereof.

12. The method of claim 1, wherein the hard mask layer is selected from the group consisting of $SiO_2$, SiN, SiON, SiOC, SiC, a-Si, SiARC, and combinations thereof.

13. The method of claim 1, wherein the surface active layer comprises an inorganic material.

14. The method of claim 1, wherein the surface active layer is hydrophilic.

15. The method of claim 1, wherein the surface active layer is functionalized with the group consisting of COOH, OH, $NH_2$, and combinations thereof.

16. The method of claim 1, wherein the surface active layer is formed using a self-assembled monolayer (SAM), polymer brush, or both.

* * * * *